United States Patent
Ide

(10) Patent No.: US 10,446,713 B2
(45) Date of Patent: Oct. 15, 2019

(54) METHOD FOR PRODUCING LIGHT-EMITTING DEVICE

(71) Applicant: TOYODA GOSEI CO., LTD., Kiyosu-shi (JP)

(72) Inventor: Kimiyasu Ide, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/139,533

(22) Filed: Sep. 24, 2018

(65) Prior Publication Data
US 2019/0097080 A1    Mar. 28, 2019

(30) Foreign Application Priority Data

Sep. 28, 2017  (JP) ................................. 2017-189063

(51) Int. Cl.
  *H01L 33/20* (2010.01)
  *H01L 33/22* (2010.01)
  *H01L 33/00* (2010.01)

(52) U.S. Cl.
  CPC .......... *H01L 33/20* (2013.01); *H01L 33/0075* (2013.01); *H01L 33/22* (2013.01)

(58) Field of Classification Search
  CPC ..... H01L 33/0075; H01L 33/20; H01L 33/22; H01L 21/0272; H01L 21/308–3086; H01L 21/32; H01L 21/32139; H01L 21/467; H01L 21/469–47576
  See application file for complete search history.

(56) References Cited

U.S. PATENT DOCUMENTS

| 5,496,438 | A | * | 3/1996 | Wootton | G03F 7/427 134/1.1 |
| 5,744,402 | A | * | 4/1998 | Fukazawa | H01L 21/02071 438/706 |
| 6,682,659 | B1 | * | 1/2004 | Cho | H01L 21/31116 216/13 |
| 7,517,807 | B1 | * | 4/2009 | Tucker | H01L 21/0332 438/739 |
| 2002/0068685 | A1 | * | 6/2002 | Wojtczak | C11D 7/261 510/175 |
| 2003/0153170 | A1 | * | 8/2003 | Wada | H01L 21/28518 438/595 |

(Continued)

FOREIGN PATENT DOCUMENTS

JP    2007-088008 A    4/2007
JP    2009-283762 A   12/2009

(Continued)

*Primary Examiner* — Zandra V Smith
*Assistant Examiner* — Jeremy J Joy
(74) *Attorney, Agent, or Firm* — McGinn I. P. Law Group, PLLC

(57) ABSTRACT

To remove the mask formed by nanoimprinting after dry etching. A mask is formed by nanoimprinting on a back surface of a substrate. Subsequently, dry etching is performed using chlorine gas. Dry etching is finished with the mask kept remaining. A deteriorated layer is formed on the surface of the remaining mask. The mask is irradiated with plasma generated using a mixture gas of nitrogen and oxygen. Thereby, the deteriorated layer formed on the surface of the mask is removed by evaporation. The mask is removed by dissolving in BHF (buffered hydrofluoric acid).

16 Claims, 4 Drawing Sheets

(56) References Cited

U.S. PATENT DOCUMENTS

| | | | | |
|---|---|---|---|---|
| 2004/0216770 | A1* | 11/2004 | Chen | H01L 21/02071 134/30 |
| 2005/0026335 | A1* | 2/2005 | Omote | H01L 21/7684 438/128 |
| 2006/0261034 | A1* | 11/2006 | Kurashima | B41J 2/1404 216/27 |
| 2007/0176193 | A1* | 8/2007 | Nagai | H01L 33/505 257/98 |
| 2008/0047929 | A1* | 2/2008 | Wang | B29D 11/00365 216/24 |
| 2009/0141764 | A1* | 6/2009 | Yagi | H01S 5/2231 372/45.01 |
| 2009/0240215 | A1* | 9/2009 | Humayun | A61F 9/0017 604/290 |
| 2010/0052071 | A1* | 3/2010 | Niimi | H01L 21/82384 257/369 |
| 2013/0084352 | A1* | 4/2013 | Suzuki | B29C 59/002 425/385 |
| 2013/0260492 | A1* | 10/2013 | Jin | H01L 33/22 438/29 |
| 2013/0284701 | A1* | 10/2013 | Yoshida | G03F 7/427 216/64 |
| 2014/0103391 | A1* | 4/2014 | Haruta | H01L 33/22 257/103 |
| 2014/0371124 | A1* | 12/2014 | Harada | C11D 11/0047 510/175 |
| 2015/0118604 | A1* | 4/2015 | Dynes | H01L 21/302 430/5 |
| 2015/0364647 | A1* | 12/2015 | Timmering | H01L 33/0075 257/76 |
| 2016/0225942 | A1* | 8/2016 | Aota | H01L 33/22 |
| 2017/0133548 | A1* | 5/2017 | Kitano | H01L 33/0075 |
| 2017/0288061 | A1* | 10/2017 | Sasaki | H01L 29/812 |
| 2019/0058084 | A1* | 2/2019 | Piao | H01L 33/0054 |

FOREIGN PATENT DOCUMENTS

| | | | |
|---|---|---|---|
| JP | 2014-143330 A | 8/2014 | |
| KR | 20090116212 A * | 11/2009 | |
| KR | 101233062 B1 * | 2/2013 | H01L 33/0066 |

* cited by examiner

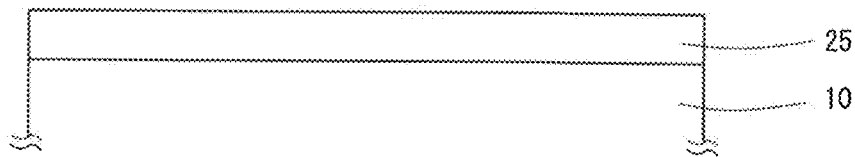
FIG. 4A
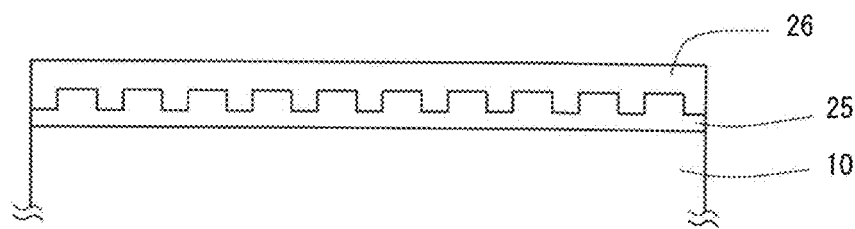
FIG. 4B
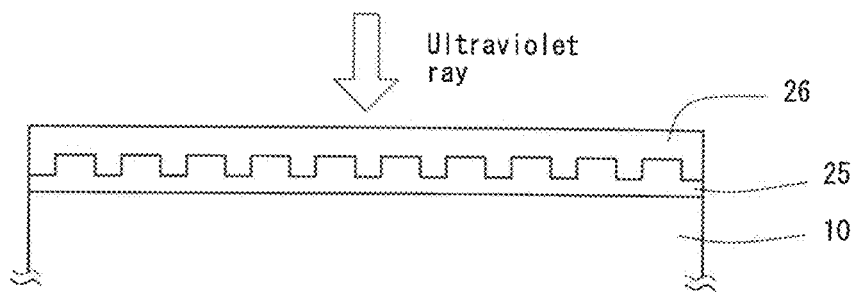
FIG. 4C
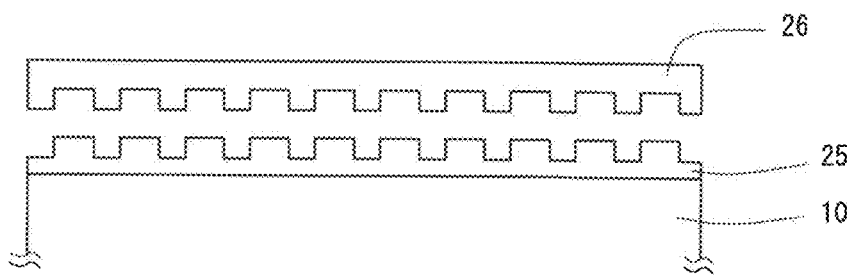
FIG. 4D
FIG. 5
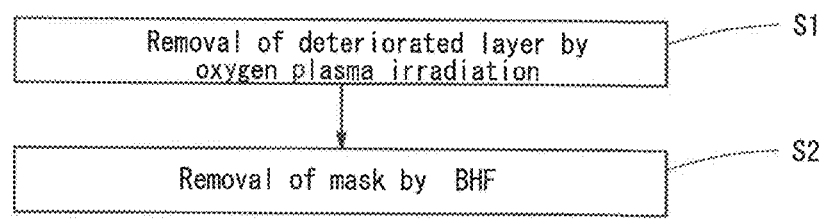

| | SEM images | |
|---|---|---|
| | Plane ×35000 | Cross section ×70000 |
| After dry etching |  |  |
| After removal of mask 20 |  |  |

METHOD FOR PRODUCING LIGHT-EMITTING DEVICE

BACKGROUND OF THE INVENTION

Field of the Invention

The present invention relates to a method for producing a light-emitting device, more specifically to a method for forming an uneven shape on a substrate.

Background Art

In the production of a light-emitting device, an uneven shape is formed on a front surface or a back surface of a substrate to improve light extraction efficiency. Such uneven-shaped mask pattern is formed by photolithography or nanoimprinting.

A mask is formed by nanoimprinting in the following procedure. Firstly, liquid resin is applied to the surface of the substrate, a mold having an uneven-shaped pattern is pressed against the liquid resin from above. In this state, resin is cured by irradiating with an ultraviolet ray. After that, a mask to which the uneven-shaped pattern of the mold is transferred is formed by removing the mold.

Japanese Patent Application Laid-Open (kokai) No. 2014-143330 discloses a method for forming an uneven shape on the surface of the substrate that a mask is formed by nanoimprinting and dry etching is performed using a chlorine-based gas. Dry etching causes an impurity layer on the uneven surface of the substrate, and the impurity layer is removed by an acid solution containing peroxide. Dry etching may be finished with the mask kept remaining. The remaining mask may be removed together with the impurity layer by the acid solution containing peroxide.

The inventors studied that dry etching by chlorine based gas is finished with the mask formed by nanoimprinting kept remaining, and then the remaining mask is removed by BHF (buffered hydrofluoric acid). However, it was found that the mask remaining after dry etching cannot be removed by BHF because the properties of the mask are changed.

SUMMARY OF THE INVENTION

In view of the foregoing, an object of the present invention is to provide a method for removing the remaining mask when a mask is formed by nanoimprinting on a substrate, and an uneven shape is formed by dry etching.

In an aspect of the present invention, there is provided a method for producing a light-emitting device including an uneven shape formation step of forming an uneven shape on a front surface or a back surface of a substrate. The uneven shape formation step comprises a mask formation step of forming a mask being made of cured resin and having an uneven shape on a substrate by nanoimprinting, a dry etching step of forming an uneven shape on a substrate by dry etching using a chlorine based gas and finishing dry etching with the mask kept remaining, a deteriorated layer removal step of removing a deteriorated layer on the surface of the mask by irradiating with plasma using an oxygen based gas, and a mask removal step of removing the mask using BHF.

In the deteriorated layer removal step, oxygen or ozone is preferably used as oxygen based gas. Consequently, the deteriorated layer can be efficiently removed. Moreover, plasma is preferably induction coupling plasma, the antenna power is preferably 100 W to 600 W, and the bias power is preferably 10 W to 60 W. Consequently, the deteriorated layer can be efficiently removed. The plasma irradiation time is 3 to 10 minutes. Within this range, the deteriorated layer can be efficiently and sufficiently removed.

In the mask removal step, the hydrofluoric acid concentration of BHF is preferably 15% to 35%. When the hydrofluoric acid concentration is higher than 35%, a protective film for protecting electrodes may be removed, which is not desirable. When the hydrofluoric acid concentration of BHF is lower than 15%, the mask removal speed is decreased, which is not desirable. The BHF temperature is preferably 40° C. to 80° C. Within this range, the mask can be efficiently removed. The time of treatment in BHF is preferably 10 to 30 minutes. Within this range, the mask can be efficiently removed.

The present invention may be applied to any substrate material. However, the present invention is especially effective for a light-emitting device using a Group III nitride semiconductor or sapphire substrate.

In the present invention, even if dry etching by chlorine based gas is finished in the middle of the process, and the mask formed by nanoimprinting remains, the mask can be removed later. Therefore, the selection range of uneven shape on the substrate can be expanded.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 4A to 4D are sketches showing processes for producing the light-emitting device according to Embodiment 1;

FIG. 5 is a diagram showing a mask 20 removal process; and

DETAILED DESCRIPTION OF PREFERRED EMBODIMENT

With reference to the drawings, specific embodiment of the production method for producing a light-emitting device as an example will next be described in detail. However, this embodiment should not be construed as limiting the invention thereto.

Embodiment 1

Figure 1:
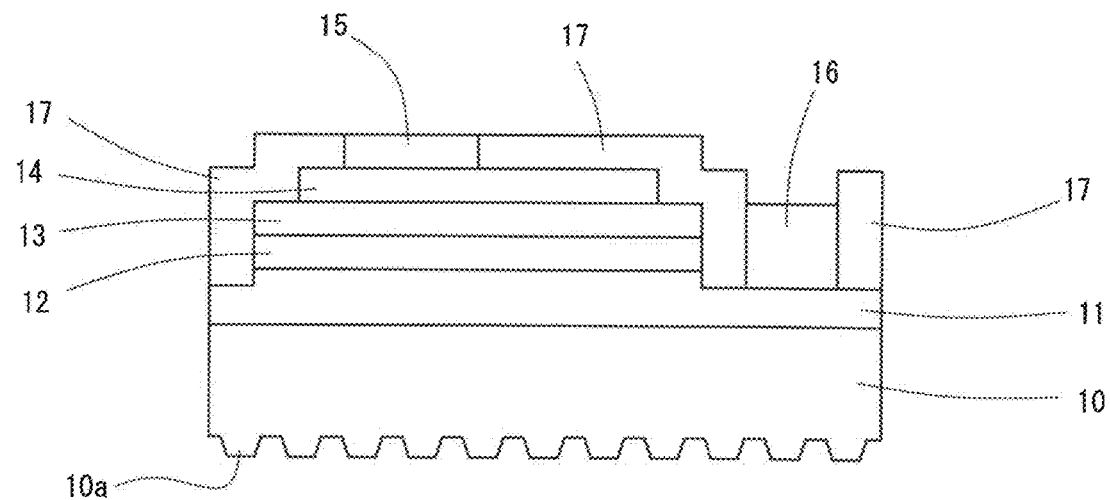
FIG. 1 is a schematic view of the structure of a light-emitting device according to Embodiment 1.

FIG. 1 is a schematic view of the structure of a light-emitting device according to Embodiment 1. As shown in FIG. 1, the light-emitting device according to Embodiment 1 includes a GaN substrate 10; and an n-type layer 11, a light-emitting layer 12, and a p-type layer 13, which are sequentially deposited on the surface of the substrate 10. A transparent electrode 14 is formed on the p-type layer 13, and a p-electrode 15 is formed on the transparent electrode 14. A trench reaching from the surface of the p-type layer 13 to the n-type layer 11 is formed, and an n-electrode 16 is formed on the n-type layer 11 exposed on the bottom surface of the trench. Moreover, the top surface except for the p-electrode 15 and the n-electrode 16 is covered with an insulating film 17. The light-emitting device according to Embodiment 1 is a flip-chip type device, and has a structure which extracts light from the back surface of the substrate 10.

The material of the substrate 10 is not limited to GaN, any material may be used as long as the material is transparent to the emission wavelength. For example, Group III nitride semiconductor such as AlGaN and InGaN other than GaN or sapphire may be used. The back surface of the substrate 10 (surface opposite to the side with which the n-type layer 11 is in contact) has an uneven shape. This uneven shape improves light extraction.

The uneven shape on the back surface of the substrate 10 has a pattern in which a plurality of protrusions 10a is periodically arranged. The protrusions 10a have a truncated cone shape, and are arranged in a triangular lattice shape (refer to FIG. 2). The protrusions 10a have any shape such as a truncated pyramid other than a truncated cone as long as the shape has a flat top surface. In the method for producing a light-emitting device according to Embodiment 1 described later, the surface below the remaining mask 20 is flat because dry etching is finished with the mask 20 formed by nanoimprinting kept remaining. As a result, the protrusions have a shape having a flat top surface. The disposed pattern of the protrusions 10a may be any periodic pattern of such as a square lattice other than a triangular lattice.

The n-type layer 11, the light-emitting layer 12 and the p-type layer 13 may have any conventionally known structure. The electrode may have any conventionally known structure.

Figure 2:
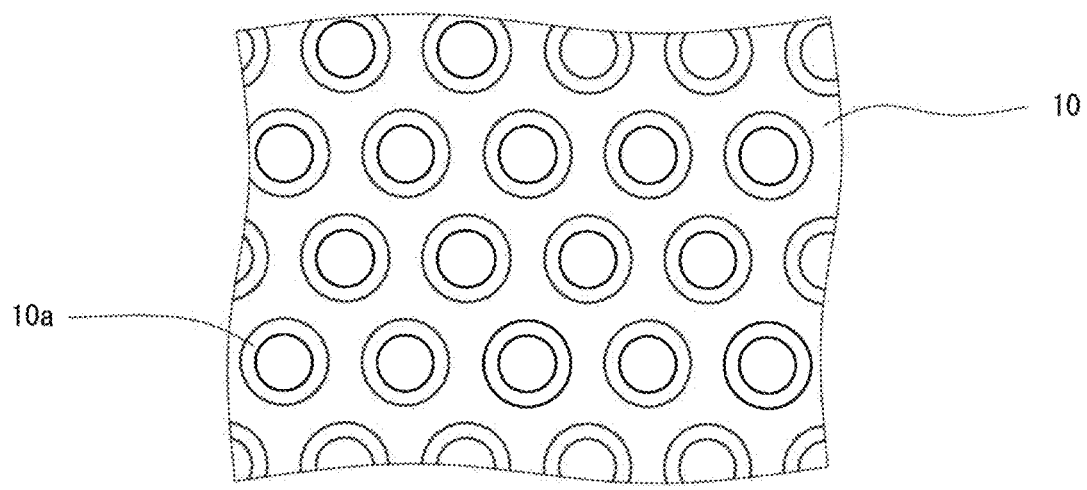
FIG. 2 is a schematic view showing an uneven pattern on a back surface of a substrate 10.

The method for producing a light-emitting device according to Embodiment 1 will next be described with reference to FIG. 2.

Figure 3A:
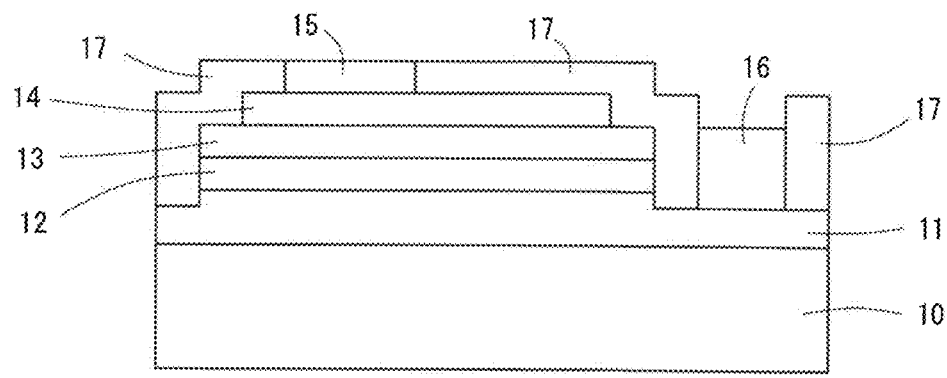
FIGS. 3A to 3D are sketches showing processes for producing the light-emitting device according to Embodiment 1.

Firstly, an element structure of a light-emitting device is formed on a GaN substrate 10. More specifically, firstly, an n-type layer 11, a light-emitting layer 12, and a p-type layer 13 are sequentially deposited through MOCVD on the substrate 10. Subsequently, a transparent electrode 14 is formed by sputtering or vapor deposition in a predetermined region on the p-type layer 13, and a p-electrode 15 is formed by sputtering or vapor deposition on the transparent electrode 14. The region for forming an n-electrode 16 is dry etched to expose the n-type layer 11. Next, an n-electrode 16 is formed by sputtering or vapor deposition on the n-type layer 11. After that, an insulating film 17 is formed so as to cover the entire top surface except for the p-electrode 15 and the n-electrode 16 (refer to FIG. 3A).

Subsequently, the thickness of the substrate 10 is thinned to 140 μm by grinding the back surface of the substrate 10. The thickness of the substrate 10 is not limited to this value. However, the thickness of the substrate 10 is preferably reduced to 50 μm to 250 μm for ease of light extraction or dicing. Moreover, the thickness of the substrate is preferably 50 to 250 μm from the viewpoint of improving the light extraction efficiency.

Figure 3B:
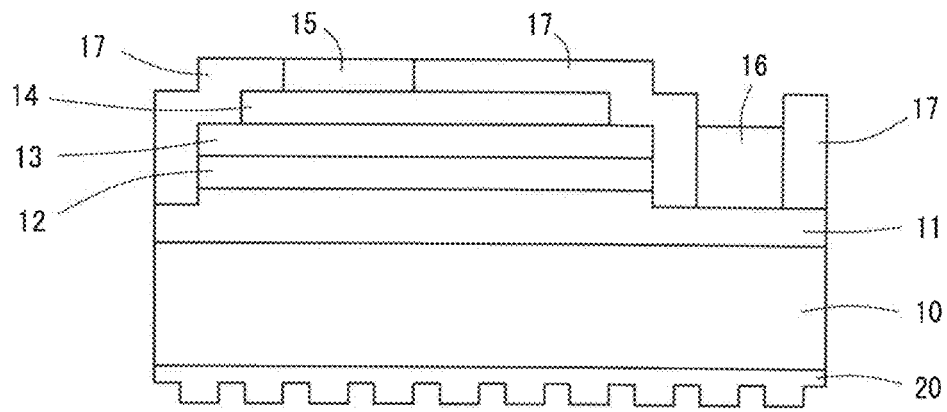

A mask 20 is formed by nanoimprinting on the back surface of the substrate 10 (refer to FIG. 3B). The front surface of the mask 20 has an uneven shape, the recess region is thinner than the protrusion region. The uneven shape has a pattern in which circles are periodically arranged in a triangular lattice shape in a plan view. The specific procedures are as follows.

Firstly, a liquid resin 25 is applied on the back surface of the substrate 10 (refer to FIG. 4A). The resin 25 is applied by, for example, spin coating, ink jet coating, or spray coating. The resin 25 is a one-liquid type epoxy resin. The resin 25 is not limited to this, and may be, for example, epoxy resin and urethane resin as long as it is an ultraviolet curing resin used in nanoimprinting.

Subsequently, a mold 26 having an uneven pattern which is transparent for an ultraviolet ray is pushed to the resin 25 from above (refer to FIG. 4B). Since the resin 25 is liquid, the portions contacting the protrusions of the mold 26 are pushed out and thinned. The portions pushed out enter into the recesses of the mold 26.

Next, the resin 25 is cured by irradiating with an ultraviolet ray through the mold 26 with the mold 26 pushed to the resin 25 (refer to FIG. 4C).

Then, the mold 26 is removed from the cured resin 25 (refer to FIG. 4D). In this way, a mask 20 is formed, which is made of the cured resin and has the uneven pattern of the mold 26 transcribed on the surface thereof. The recess region of the mask 20 preferably has a thickness of 5 nm or less. This is because, in the subsequent procedure, a time until the substrate 10 is exposed by etching the recess region can be shortened, thereby facilitating the formation of the uneven shape on the substrate 10.

Figure 3C:
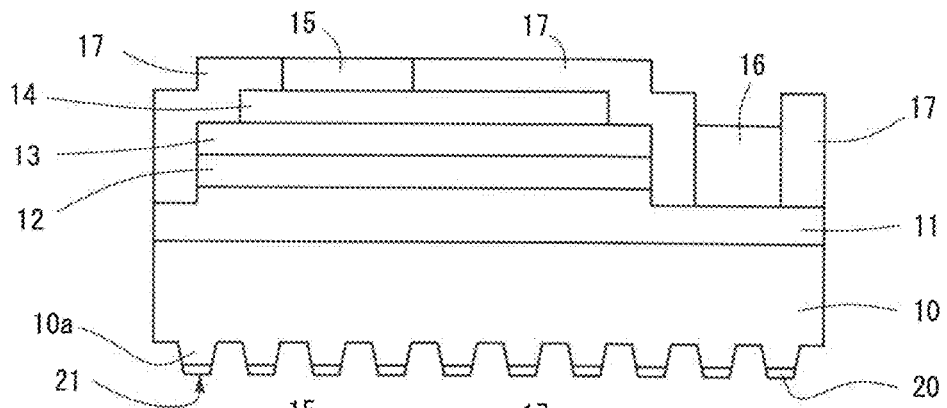

Dry etching is performed using chlorine gas. An ICP (Inductively Coupled Plasma) apparatus is employed, the gas flow rate is set to 40 sccm, the antenna power/bias power is set to 150 (W)/50 (W), the pressure is set to 0.7 Pa, and the etching rate is 100 nm/min. Any gas containing chlorine based gas, for example, $BCl_3$ and $SiCl_4$ may be used. A mixture gas containing chlorine based gas may be used. The mask 20 is thinned by dry etching. The uneven shape on the surface of the mask 20 has different thicknesses, the recess portions of the mask 20 are all etched to expose the surface of the substrate 10. After the surface of the substrate 10 was exposed, the substrate 10 is etched. The etched side surface is inclined. Dry etching is finished with the mask 20 on the protrusions kept remaining after the mask 20 corresponding to the recess portions were all etched and the substrate 10 was etched (refer to FIG. 3C). At this stage, the substrate 10 may be etched to any depth. As a result of dry etching, on the back surface of the substrate 10, an uneven shape is formed in a pattern where truncated cone shaped protrusions 10a are periodically arranged in a triangular lattice shape, and the mask 20 remains on the top surfaces of the protrusions 10a.

The inventors studied whether the remaining mask 20 can be removed or not by BHF (buffered hydrofluoric acid). They found that the remaining mask 20 cannot be removed by BHF. The remaining mask 20 was subjected to element analysis by photoelectron spectroscopy, and Cl was detected from the surface of the mask 20. From this result, a deteriorated layer 21 is considered to be formed through the reaction of the cured resin with chlorine on the surface of the remaining mask 20. That is, the mask 20 cannot be removed only by BHF because the deteriorated layer 21 is formed on the surface of the mask by dry etching using a chlorine based gas, which is resistant to BHF. Therefore, the remaining mask 20 is removed by the steps shown in FIG. 5.

Firstly, the mask 20 is irradiated with plasma generated using a mixture gas of nitrogen and oxygen (step B1 of FIG. 5). Plasma is generated using an ICP device at an oxygen flow rate of 100 sccm and an nitrogen flow rate of 10 sccm, at an antenna power/bias power of 300 (W)/30 (W), and at a pressure of 5.0 Pa. The plasma irradiation time is three minutes. Thereby, the deteriorated layer 21 formed on the surface of the mask 20 is removed by evaporation.

The plasma irradiation conditions are not limited to the above as long as the conditions described below are satisfied.

Gas for generating plasma is not limited to oxygen, any gas may be used as long as it is an oxygen based gas such as ozone. A mixture gas obtained by mixing an inactive gas such as nitrogen and argon with the oxygen based gas may be used.

The oxygen plasma irradiation time may be three minutes or more. Thus, the deteriorated layer 21 can be sufficiently removed. However, when the irradiation time is longer, the surface of the substrate 10 may be affected. Therefore, the irradiation time is preferably ten minutes or less, more preferably three to eight minutes, and further preferably three to six minutes.

Plasma is generated by various methods including induction coupling plasma (ICP), capacity coupling plasma (CCP), and electronic cyclotron resonance plasma (ECP). In the case of ICP, the antenna power is preferably 100 W to 600 W. Within this range, the deteriorated layer 21 can be efficiently removed. The antenna power is more preferably 200 W to 500 W, and further preferably 250 W to 450 W. For the same reason, the bias power is preferably 10 W to 60 W, more preferably 20 W to 50 W, and further preferably 25 W to 45 W.

The mask 20 is removed by dissolving in BHF (buffered hydrofluoric acid) (step S2 of FIG. 5). The step S2 is performed at a BHF temperature of 60° C. for 20 minutes. When the deteriorated layer 21 is formed on the surface of the mask 20, the deteriorated layer 21 acts as an etching stopper because it is resistant to BHF. As a result, the mask 20 cannot be removed. Therefore, the deteriorated layer 21 on the surface of the mask 20 is removed by oxygen plasma irradiation in the previous step S1, and the mask is removed by dissolving in BHF. Before soaking the element in BHF, a resist protective film (not illustrated) is formed on the entire top surface of the element to prevent the electrodes or the insulating film from being etched.

The BHF temperature is preferably 40° C. to 80° C. Within this range, the mask 20 can be efficiently removed. The BHF temperature is more preferably 50° C. to 70° C., and further preferably 55° C. to 65° C.

The hydrofluoric acid concentration of BHF is preferably 15% to 35%. When the hydrofluoric acid concentration is higher than 35%, the protective film on the top surface of the element is removed, thereby to expose the electrodes. As a result, the electrodes may be etched, which is not desirable. When the hydrofluoric acid concentration of BHF is lower than 15%, the mask 20 cannot be removed or the mask removal speed is decreased. As a result, it takes time to remove the mask, which is not desirable. The hydrofluoric acid concentration of BHF is more preferably 17% to 33%, and further preferably 20% to 30%.

The BHF etching time is arbitrary as long as the mask 20 is entirely removed, for example, 10 to 30 minutes. When the BHF etching time is less than 10 minutes, the mask 20 may not be sufficiently removed. The BHF etching time is more preferably 15 to 25 minutes, and further preferably 18 to 22 minutes.

Figure 3D:
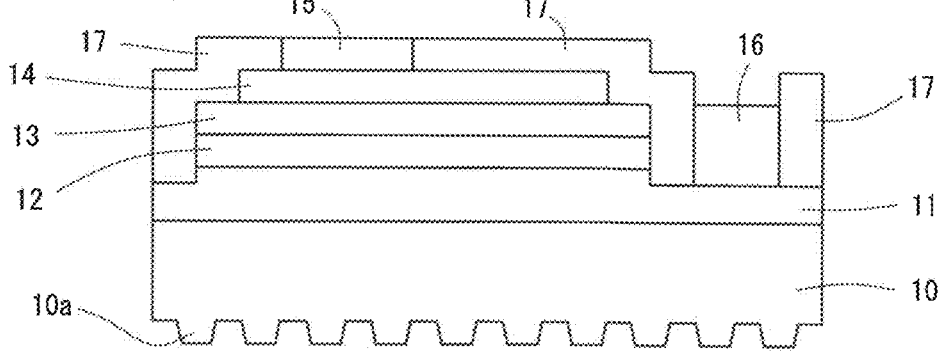

Thus, the mask 20 can be dissolved and removed by soaking in BHF after irradiating the surface of the mask 20 with oxygen plasma (refer to FIG. 3D).

After that, the protective film formed on the top surface of the element is removed by acetone, and washed with isopropyl alcohol (IPA) and pure water in order. Through the above, the light-emitting device according to Embodiment 1 is produced.

Figure 6:
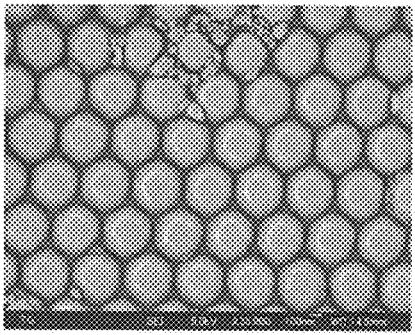
FIG. 6 shows SEM images of uneven shape on the back surface of the substrate 10.
Figure 6:
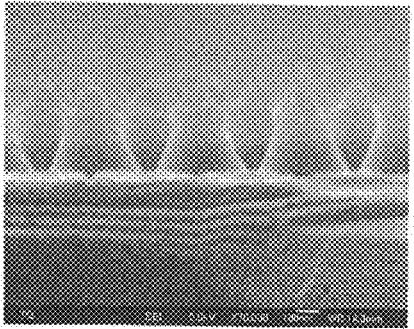
Figure 6:
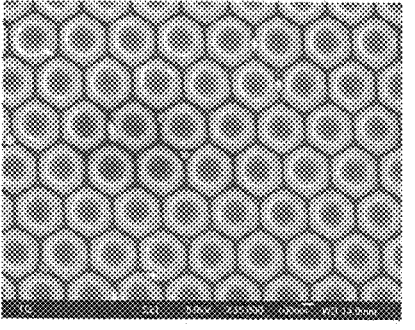
Figure 6:
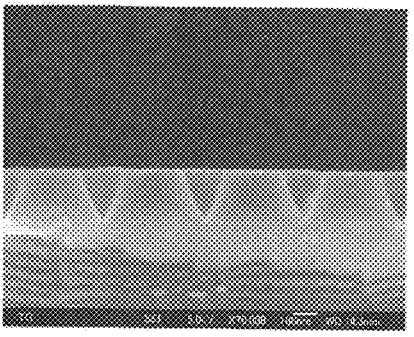

FIG. 6 shows SEM images of uneven shape on the back surface of the substrate 10 after dry etching with chlorine based gas and after removal of the mask 20 by BHF. From FIG. 6, it can be seen that the remaining mask 20 after dry etching is removed by BHF wet etching after oxygen plasma irradiation. It can also be found that an uneven shape is accurately formed by removal of the mask 20, in which protrusions having a truncated cone shape are arranged in a triangular lattice.

According to the method for producing a light-emitting device according to Embodiment 1, in the uneven shape formation step wherein a mask 20 is formed by nanoimprinting, and dry etching is performed using a chlorine based gas, thereby forming an uneven shape on a substrate 10, the mask 20 can be removed even if dry etching is finished before the mask 20 is entirely removed so that the mask 20 is left. Conventionally, the deteriorated mask 20 generated by dry etching using a chlorine based cannot be removed by BHF. Dry etching needed to be continued until the mask 20 is entirely removed. However, when the dry etching is performed until the mask 20 is entirely removed, the shape of the protrusions 10a is deformed from the truncated cone shape or the truncated pyramid. That is, the top surface of the truncated cone shape or the truncated pyramid is rounded. Accordingly it is necessary that dry etching is stopped with the mask 20 remaining on the top surfaces of the protrusions 10a. In Embodiment 1, dry etching may be finished at any stage. Therefore, an ideal shape of the protrusions 10a, i.e., the truncated cone shape or the truncated pyramid, can be obtained. And also the selection range of uneven shape formed on the substrate 10 can be expanded. More specifically, a protrusion having a flat top surface such as a truncated cone shape or a truncated pyramid can be easily formed as a protrusion shape of the uneven shape.

The light-emitting device according to Embodiment 1 is a flip-chip type device, and an uneven shape is formed on the back surface of the substrate 10. However, the present invention is applicable even when the light-emitting device has an uneven shape on the front surface of the substrate 10. For example, the present invention is also applicable to a light-emitting device in which an uneven shape is formed on the front surface of the substrate 10, and semiconductor layers are deposited on the uneven shaped surface of the substrate 10.

The light-emitting device according to Embodiment 1 is a Group III nitride semiconductor light-emitting device. However, the present invention is applicable to a light-emitting device made of any semiconductor material. The present invention is effective especially to a Group III nitride semiconductor light-emitting device.

The light-emitting device according to the present invention can be employed as a light source of an illumination apparatus or a display apparatus.

What is claimed is:

1. A method for producing a light-emitting device which includes forming an uneven shape on a front surface or a back surface of a substrate, the forming an uneven shape comprising:

forming a mask being made of cured resin and having an uneven shape on a substrate by nanoimprinting;

forming an uneven shape on a substrate by dry etching using a chlorine based gas and finishing dry etching with the mask kept remaining;

removing a deteriorated layer on the surface of the mask by irradiating with plasma using an oxygen based gas; and removing the mask using buffered hydrofluoric acid.

2. The method for producing a light-emitting device according to claim 1, wherein the oxygen based gas is oxygen or ozone.

3. The method for producing a light-emitting device according to claim 1, wherein the hydrofluoric acid concentration of the buffered hydrofluoric acid is 15% to 35%.

4. The method for producing a light-emitting device according to claim 2, wherein the hydrofluoric acid concentration of the buffered hydrofluoric acid is 15% to 35%.

5. The method for producing a light-emitting device according to claim 1, wherein the buffered hydrofluoric acid temperature is 40° C. to 80° C.

6. The method for producing a light-emitting device according to claim 2, wherein the buffered hydrofluoric acid temperature is 40° C. to 80° C.

7. The method for producing a light-emitting device according to claim 3, wherein the buffered hydrofluoric acid temperature is 40° C. to 80° C.

8. The method for producing a light-emitting device according to claim 1, wherein the time of treatment in the buffered hydrofluoric acid is 10 to 30 minutes.

9. The method for producing a light-emitting device according to claim 2, wherein the time of treatment in the buffered hydrofluoric acid is 10 to 30 minutes.

10. The method for producing a light-emitting device according to claim 1, wherein the plasma irradiation time is 3 to 10 minutes.

11. The method for producing a light-emitting device according to claim 2, wherein the plasma irradiation time is 3 to 10 minutes.

12. The method for producing a light-emitting device according to claim 1, wherein the plasma is induction coupling plasma, the antenna power is 100 W to 600 W, and the bias power is 10 W to 60 W.

13. The method for producing a light-emitting device according to claim 2, wherein the plasma is induction coupling plasma, the antenna power is 100 W to 600 W, and the bias power is 10 W to 60 W.

14. The method for producing a light-emitting device according to claim 1, wherein the substrate is made of a Group III nitride semiconductor or sapphire.

15. The method for producing a light-emitting device according to claim 1, wherein the shape of the protrusions in the uneven shape is a truncated cone or a truncated pyramid.

16. The method for producing a light-emitting device according to claim 2, wherein the shape of the protrusions in the uneven shape is a truncated cone or a truncated pyramid.

* * * * *